United States Patent
Iwasaki

(10) Patent No.: US 7,667,531 B2
(45) Date of Patent: Feb. 23, 2010

(54) SIGNAL TRANSMISSION CIRCUIT

(75) Inventor: Tadashi Iwasaki, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 146 days.

(21) Appl. No.: 11/905,685

(22) Filed: Oct. 3, 2007

(65) Prior Publication Data

US 2008/0084113 A1 Apr. 10, 2008

(30) Foreign Application Priority Data

Oct. 5, 2006 (JP) ............................. 2006-274117

(51) Int. Cl.
*G05F 1/10* (2006.01)

(52) U.S. Cl. ....................................... 327/538; 327/540

(58) Field of Classification Search .................. None
See application file for complete search history.

(56) References Cited

FOREIGN PATENT DOCUMENTS

JP 2006-60320 3/2006

*Primary Examiner*—Cassandra Cox
(74) *Attorney, Agent, or Firm*—McGinn IP Law Group, PLLC

(57) ABSTRACT

A signal transmission circuit having four lanes includes a constant voltage circuit to generate a constant voltage, a current supply circuit, and differential driver circuits respectively placed for the lanes. The current supply circuit receives a constant voltage from the constant voltage circuit and generates four currents having a value corresponding to a prescribed voltage-current conversion ratio and outputs them in parallel. The differential driver circuits respectively receive the currents output from the current supply circuit and output a voltage having an amplitude corresponding to the prescribed voltage-current conversion ratio. The current supply circuit includes a voltage divider circuit and an analog selector, which form a current supply control circuit capable of changing the voltage-current conversion ratio.

11 Claims, 8 Drawing Sheets

SIGNAL TRANSMISSION CIRCUIT

BACKGROUND OF THE INVENTION

1. Field of the Invention

The present invention relates to a signal transmission circuit and, particularly, to a signal transmission circuit of which output amplitude is variable.

2. Description of Related Art

With the advancement of LSI (Large-Scale Integrated circuit) manufacturing technology, a high-performance MPU (Micro Processor Unit) with the operating frequency of 1 GHz or higher has been developed. When such a MPU is used in information processing equipment, particularly in a server/workstation, high-speed and high-volume data transmission is required. In order to satisfy such requirement, a technique of connecting a MPU and memory modules via PTP (point-to-point) links using FB-DIMM (Fully Buffered Dual Inline Memory Module) is used, for example. The FB-DIMM architecture uses an AMB (Advanced Memory Buffer) chip for connection between memory modules in addition to a memory chip, and it employs high-speed serial interface specification "FB-DIMM High Speed Differential PTP" as a connection interface.

In the high-speed transmission, it is generally necessary to enlarge the output amplitude at the transmitting end in consideration of decay in the amplitude due to a transmission line length. However, if the output amplitude at the transmitting end is uniformly large, power consumption of a chip becomes high. To avoid this, the above interface specification allows the output amplitude to be variable according to a transmission distance. Specifically, if a transmission distance between a MPU and a memory module is relatively long, the amplitude is set to be large; on the other hand, if a transmission distance between a memory module and a memory module is relatively short, the amplitude is set to be small.

In order to make the output amplitude variable, a technique of controlling a current source of a driver is used. A specific example of such a technique is described herein with reference to FIG. 7.

The circuit shown in FIG. 7 includes a constant voltage circuit 4, a constant current circuit 2B, and a differential driver circuit 3. The constant voltage circuit 4 is a bandgap reference circuit that generates a constant voltage from a bandgap voltage of a semiconductor, and it generates a stable constant voltage having a reference amplitude.

The constant current circuit 2B includes P-channel MOS transistors 9 and 10, a P-channel MOS transistor 15, a terminating resistor 16, and a feedback amplifier 17. The P-channel MOS transistors 9 and 10 are connected with a power supply line 8 and form a constant current source. The P-channel MOS transistor 15 has a gate electrode fixed to a GND (ground voltage) level, so that it is in the ON state. The feedback amplifier 17 has an inverting terminal connected with the constant voltage circuit 4, a non-inverting terminal connected with a node between the P-channel MOS transistor 15 and the terminating resistor 16, and an output connected with a node between the gate of the P-channel MOS transistor 9 and the gate of the P-channel MOS transistor 10. The feedback amplifier 17 controls the gate voltage of the P-channel MOS transistor 9 so that the voltage at the terminating resistor 16 is equal to the voltage having a reference amplitude which is generated in the constant voltage circuit 4. A current corresponding to the reference amplitude is thereby output from the drain of the P-channel MOS transistor 10, which has the same gate voltage as the P-channel MOS transistor 9.

The differential driver circuit 3 includes N-channel MOS transistors 19, 20a, 20b, 20c and 20d that are connected with a ground line 18 to receive a constant current from the constant current circuit 2B and form a mirror circuit; P-channel MOS transistors 22a, 22b, 22c, 22d, 23a, 23b, 23c and 23d that are connected with a power supply line 21 and form a constant current source; a switch circuit 11 that connects the gates of the P-channel MOS transistors 23b, 23c and 23d with the power supply line 21 to turn OFF a corresponding constant current source; a switch circuit 12 that connects the gates of the P-channel MOS transistors 23b, 23c and 23d with the drains of the P-channel MOS transistors 22b, 22c and 22d to turn ON a corresponding constant current source; P-channel MOS transistors 24a and 24b that serve as a switch to output a logic; and terminating resistors 25a and 25b that are connected with the ground line 18. Input terminals 26a and 26b input differential logic signals inside the LSI, and in response to those inputs, a voltage value that is determined by the all current values flowing through the P-channel MOS transistors 23a, 23b, 23c, 23d and the resistances of the terminating resistors 25a and 25b is output as a logic amplitude from output terminals 27a and 27b. A constant current source that is composed of the P-channel MOS transistors 22a and 23a is constantly ON. In the following description, the logic amplitude that is output from the output terminals 27a and 27b is referred to as an output amplitude.

In the circuit having such a configuration, the switch circuit 11 that connects the gates of the P-channel MOS transistors 23b, 23c and 23d with the power supply line 21 and the switch circuit 12 that connects the gates of the P-channel MOS transistors 23b, 23c and 23d with the drains of the P-channel MOS transistors 22b, 22c and 22d are selected in a complementary fashion using a control terminal 13, so that the output amplitude corresponding to the reference amplitude is variable.

A specific example is as follows. For example, the P-channel MOS transistors 15, 24a and 24b are configured to be the same, and the terminating resistors 16, 25a and 25b are also configured to be the same. Further, the channel width size ratio of the transistor groups each constituting a constant current source (i.e. the P-channel MOS transistors 9 and 10, the P-channel MOS transistors 22a to 22d, and the P-channel MOS transistors 23a to 23d) is "5:1", "1:1:1:1", "5:1:1:1", respectively. In such a case, if the reference amplitude that is generated in the constant voltage circuit 4 is 500 mV, the output amplitude from the output terminals 27a and 27b can be 500 mV, 600 mV, 700 mV or 800 mV by controlling the switch circuit 11 and the switch circuit 12 through the control terminal 13. Thus, the circuit in FIG. 7 allows the reference amplitude of 500 mV to be variable in increments of 20%. FIG. 7 shows the case where the P-channel MOS transistors 23b to 23d are all OFF, and the output amplitude from the output terminals 27a and 27b in this case is 500 mV, which corresponds to a current value that is output only from the constant current source that is composed of the P-channel MOS transistors 22a and 23a.

In this manner, the circuit varies the output amplitude by controlling the P-channel MOS transistors 22b to 22d, and the P-channel MOS transistors 23b to 23d, each constituting a constant current source, by the switch circuit 11 and the switch circuit 12.

Japanese Unexamined Patent Application Publication No. 2006-060320 discloses a circuit that varies the output amplitude by controlling a current source of a driver, just like the circuit of FIG. 7.

FIG. 8 shows an example of the circuit that varies the output amplitude by controlling a current that is input to a driver. The circuit of FIG. 8 includes a constant voltage circuit block 1, a constant current circuit 2C, and a differential driver circuit 3A.

The constant voltage circuit block 1 includes a constant voltage circuit 4 and a voltage divider circuit 35. The constant voltage circuit 4 is a bandgap reference circuit just like the constant voltage circuit 4 in FIG. 7. The voltage divider circuit 35 includes ladder resistors, and it divides the output of the constant voltage circuit 4 by the ladder resistors and outputs a plurality of candidate reference amplitudes to the constant current circuit 2C.

The constant current circuit 2C includes P-channel MOS transistors 39 and 40, a P-channel MOS transistor 45, a terminating resistor 46, a feedback amplifier 47, and an analog selector 36. The P-channel MOS transistors 39 and 40 are connected with a power supply line 38 and form a constant current source. The P-channel MOS transistor 45 has a gate electrode fixed to a GND (ground voltage) level, so that it is in the ON state. The feedback amplifier 47 has an inverting terminal connected with the output of the analog selector 36, a non-inverting terminal connected with a node between the P-channel MOS transistor 45 and the terminating resistor 46, and an output connected with the gates of the P-channel MOS transistors 39 and 40. The feedback amplifier 47 controls the gate voltage of the P-channel MOS transistor 39 so that the voltage at the terminating resistor 46 is equal to the output voltage from the analog selector 36, so that a constant current corresponding to the output voltage from the analog selector 36 is output from the drain of the P-channel MOS transistor 40 having the same gate voltage as the P-channel MOS transistor 39. The analog selector 36 is controlled through a selection terminal 37, and the analog selector 36 selects one from the constant voltage from the constant voltage circuit 4 and a plurality of candidate reference amplitudes from the voltage divider circuit 35 and outputs the selected one to the feedback amplifier 47.

The differential driver circuit 3A includes N-channel MOS transistors 49 and 50 that are connected with a ground line 48 to receive a constant current from the constant current circuit 2C and form a mirror circuit, P-channel MOS transistors 52 and 53 that are connected with a power supply line 51 and form a constant current source, P-channel MOS transistors 54a and 54b that serve as a switch to output a logic, and terminating resistors 55a and 55b that are connected with the ground line 48. Further, an output terminal 57a and an output terminal 57b are respectively connected between the P-channel MOS transistor 54a and the terminating resistor 55a and between the P-channel MOS transistor 54b and the terminating resistor 55b. Input terminals 56a and 56b input differential logic signals inside the LSI, and in response to those inputs, a voltage value that is determined by the current flowing through the P-channel MOS transistor 53 and the resistances of the terminating resistors 55a and 55b is output as a logic amplitude from output terminals 57a and 57b.

In this configuration, the circuit employs the selection terminal 37 as a switch to select a desired reference amplitude from the voltage divider circuit 35, thereby varying the output amplitude of the differential driver circuit 3A.

For example, the P-channel MOS transistor 45 and the P-channel MOS transistors 54a and 54b are configured to be the same, and the terminating resistor 46 and the terminating resistors 55a and 55b are also configured to be the same. Further, the N-channel MOS transistor 49 and the N-channel MOS transistor 50 are configured to be the same. The channel width size ratio of the transistors constituting a constant current source (i.e. the P-channel MOS transistors 39 and 40 and the P-channel MOS transistors 52 and 53) is set to "5:1:1:5".

In such a case, if the reference amplitude generated in the constant voltage circuit 4 is 500 mV, and the voltage dividing ratio of the ladder resistors of the voltage divider circuit 35 is incremented in steps of 5%, the output amplitude from the output terminals 57a and 57b is variable in decrements of 5%, such as 500 mV, 475 mV, 450 mV, 425 mV and so on.

A margin test is sometimes conducted during the shipping test of products in order to ensure that there is no problem about manufacturing fluctuations or characteristics change due to degradation over time. Because the operating frequency of testing equipment such as a LSI tester is relatively low, like several hundreds of MHz, it is general to perform a loopback test or an end-to-end test with the use of an actual device in the high-speed actual operation test. The test may include checking whether a signal can be received correctly by reducing the output amplitude on purpose, and it is thus preferred to apply the structure that makes the output amplitude variable to such a test as well.

Further, as recent memory modules offer high performance, it is necessary to set the output amplitude corresponding to a trace difference in signal lines on DIMM in consideration of the amplitude decay due to a trace difference in signals line on DIMM. Thus, the output amplitude should be large in the lane with a long signal line trace, and the output amplitude should be small in the lane with a short signal line trace. Therefore, an AMB chip to be mounted in such DIMM needs to have the structure that enables the setting of a different output amplitude for each lane.

In order to implement the above structure in the signal transmission circuit having a plurality of lanes with the use of the circuit shown in FIG. 7, it is necessary to place the same number of pairs of the constant current circuit 2B and the differential driver circuit 3 as the number of lanes, which causes an increase in packaging area and power consumption. Further, in order to adjust the output width of each lane during the margin test, it is necessary to configure setting for each lane, thus taking a long time for the setting of the margin test.

Likewise, in order to implement the above structure in the signal transmission circuit having a plurality of lanes with the use of the circuit shown in FIG. 8, it is necessary to place the same number of units from the voltage divider circuit 35 to the differential driver circuit 3A as the number of lanes, which also causes an increase in packaging area and power consumption. It also takes a long time for the setting of the margin test.

SUMMARY

In one aspect of the present invention, there is provided a signal transmission circuit including two or more prescribed number of lanes. The signal transmission circuit includes a constant voltage circuit, a current supply circuit, and a driver circuit placed for each lane.

The constant voltage circuit generates a constant voltage, which is a voltage having a reference amplitude, for example.

The current supply circuit receives a constant voltage from the constant voltage circuit, generates the same number of currents having a value corresponding to a prescribed voltage-current conversion ratio as the lanes, and outputs the currents in parallel. The current supply circuit includes a current supply control circuit capable of changing the prescribed voltage-current conversion ratio.

The driver circuit that is placed for each lane receives a current output from the current supply circuit and outputs a voltage having an amplitude corresponding to the prescribed voltage-current conversion ratio.

The description that each of the currents output in parallel from the current supply circuit has a value corresponding to "a prescribed voltage-current conversion ratio" for a constant voltage from the constant voltage circuit merely indicates the relationship between the value of each current that is finally output from the current supply circuit and the value of the constant voltage, and it does not specify a technique of conversion. Thus, the current supply control circuit capable of changing the voltage-current conversion ratio may be any circuit that can obtain different current values from the same input voltage.

In other aspects, the present invention may be implemented as a method or a system.

The technique according to the present invention enables high-speed margin test while suppressing an increase in circuit size in the configuration of a signal circuit which includes a plurality of lanes and in which the output amplitude from each lane is variable.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Exemplary embodiments of the present invention are described hereinafter with reference to the drawings.

First Embodiment

Figure 1:
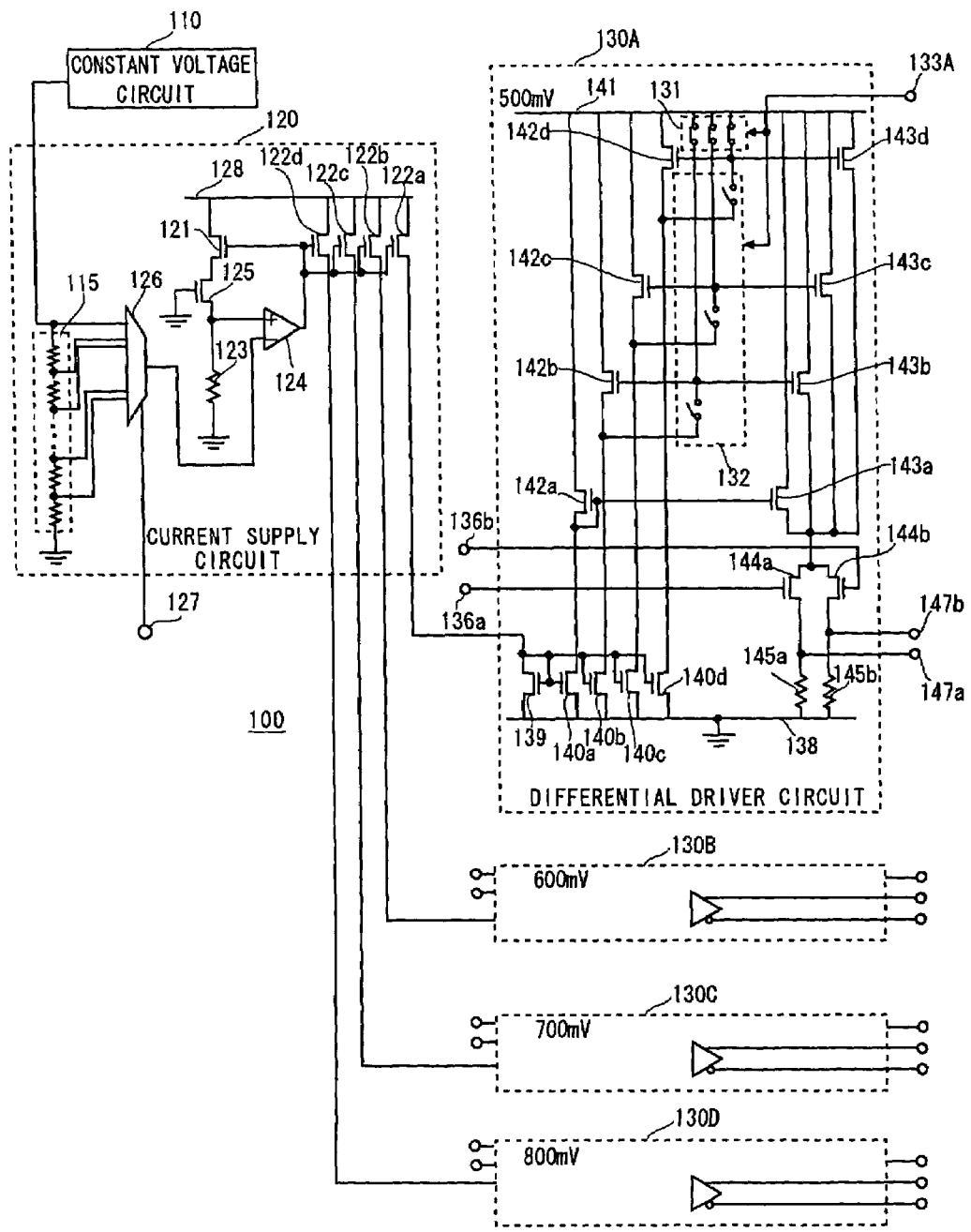
FIG. 1 is a view showing the configuration of a signal transmission circuit according to a first embodiment of the present invention.

FIG. 1 shows the configuration of a signal transmission circuit 100 according to a first embodiment of the present invention. The signal transmission circuit 100 includes a plurality of lanes, in which a different output amplitude can be set for each lane. The signal transmission circuit 100 includes a constant voltage circuit 110, a current supply circuit 120, and differential driver circuits 130A to 130D of the same number as the lanes (which is four in the example of FIG. 1).

The constant voltage circuit 110 is a bandgap reference circuit that generates a stable constant voltage and outputs it to the current supply circuit 120.

The current supply circuit 120 includes a voltage divider circuit 115, an analog selector 126, P-channel MOS transistors 121 and 122a to 122d, a P-channel MOS transistor 125, a terminating resistor 123, and a feedback amplifier 124.

The voltage divider circuit 115 includes ladder resistors, and it divides the output of the constant voltage circuit 110 by the ladder resistors and outputs a plurality of candidate reference amplitudes to the analog selector 126. The output voltage of the constant voltage circuit 110 is also supplied to the analog selector 126 as one candidate reference amplitude.

The analog selector 126 is controlled through a selection terminal 127, and it selects one from a plurality of candidate reference amplitudes from the constant voltage circuit 110 and the voltage divider circuit 115 and outputs the selected one to the feedback amplifier 124.

The P-channel MOS transistor 125 has an gate electrode fixed to a ground voltage level, so that it is in the ON state. The feedback amplifier 124 has an inverting terminal connected with the output of the analog selector 126, a non-inverting terminal connected with a node between the P-channel MOS transistor 125 and the terminating resistor 123, and an output connected with the gates of the P-channel MOS transistor 121 and the P-channel MOS transistors 122a to 122d. The P-channel MOS transistor 121 has a source connected with a power supply line 128. The feedback amplifier 124 controls the gate voltage of the P-channel MOS transistor 121 so that the voltage at the terminating resistor 123 is equal to the reference amplitude from the analog selector 126, thereby generating a constant current flowing through the P-channel MOS transistor 121. Thus, the P-channel MOS transistor 121, the P-channel MOS transistor 125, the feedback amplifier 124 and the terminating resistor 123 serve as a constant current generation unit that generates a constant current by receiving the output voltage from the analog selector 126.

The P-channel MOS transistors 122a to 122d are transistors of the same number as the lanes in the signal transmission circuit 100. Each transistor forms a mirror circuit together with the P-channel MOS transistor 121. Each transistor has the same gate voltage as the gate voltage of the P-channel MOS transistor 121 and outputs a current in accordance with a constant current flowing through the P-channel MOS transistor 121 to a corresponding differential driver circuit from its drain. Thus, the P-channel MOS transistors 122a to 122d serve as a constant current output unit.

In this way, a constant current corresponding to the reference amplitude from the analog selector 126 is supplied to the differential driver circuits 130A to 130D in each lane.

Because a constant current that is supplied to the differential driver circuits 130A to 130D varies by the reference amplitude that is selected by the analog selector 126, the voltage divider circuit 115 and the analog selector 126 serve as a current supply control circuit.

The differential driver circuits 130A to 130D have the same configuration. Thus, only the differential driver circuit 130A is described herein.

Figure 7:
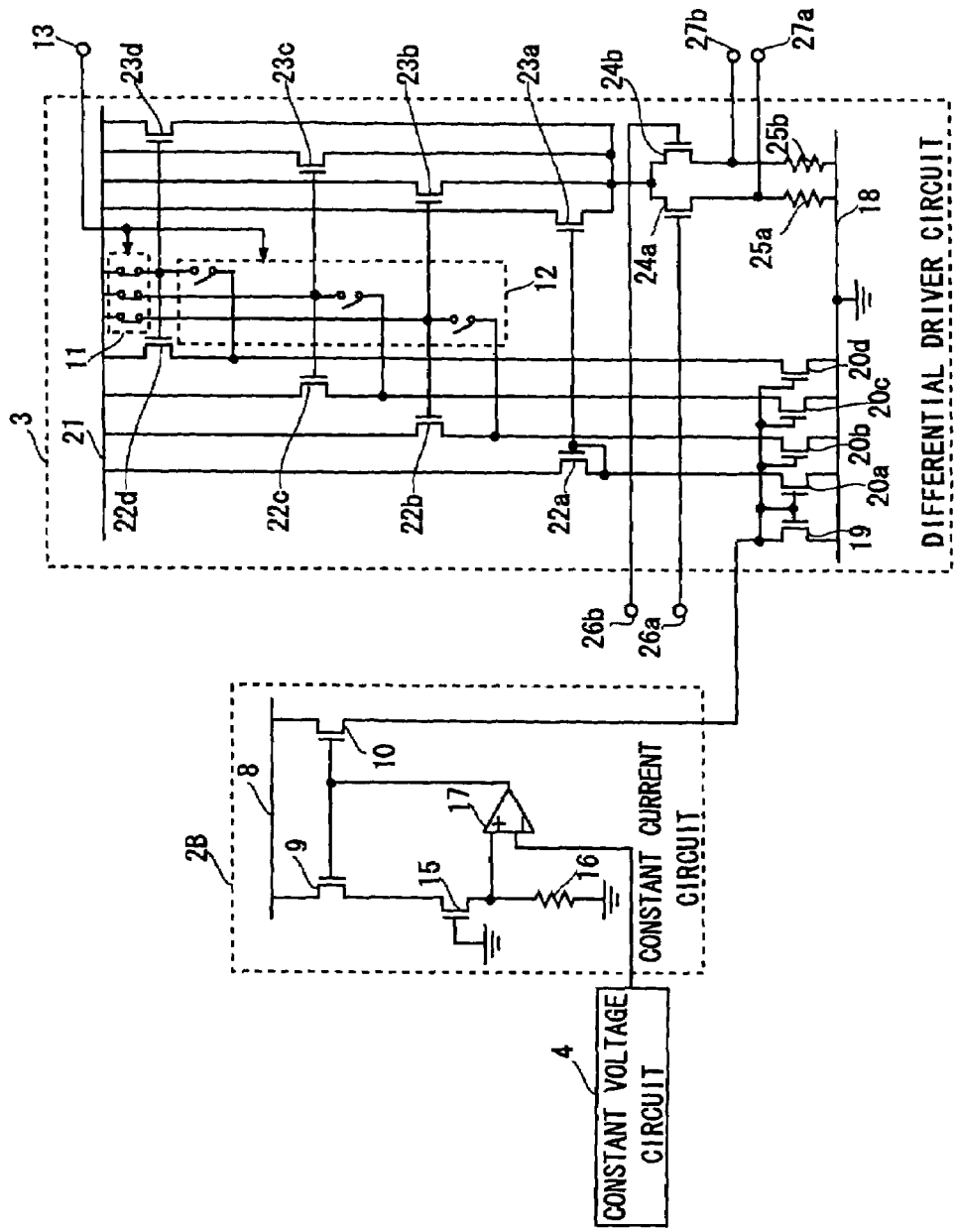
FIG. 7 is a view to describe a signal transmission circuit according to a related art.
Figure 8:
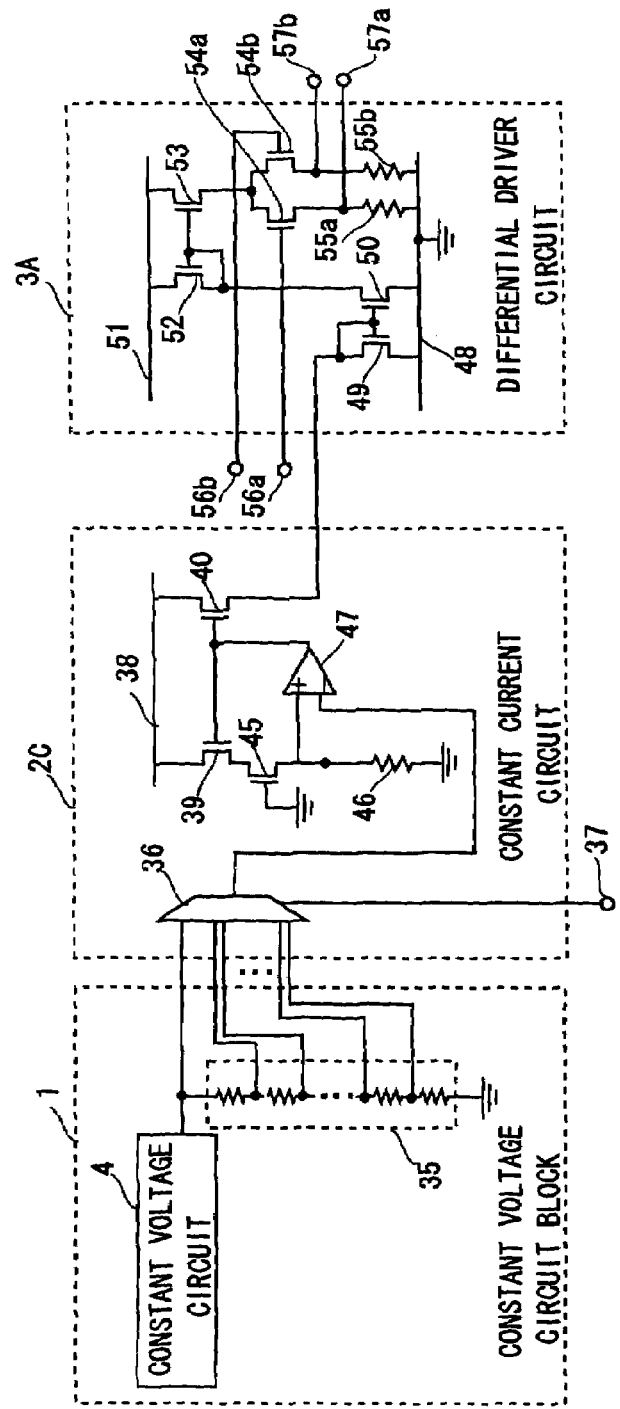
FIG. 8 is a view to describe a signal transmission circuit according to another related art.

The differential driver circuit 130A has the same configuration as the differential driver circuit 3 in the circuit of FIG. 7. The differential driver circuit 130A includes N-channel MOS transistor 139 and N-channel MOS transistors 140a to 140d that are connected with a ground line 138 to receive one constant current (which is a constant current from the drain of the P-channel MOS transistor 122a in the example of FIG. 1) that is output from the current supply circuit 120 and form a mirror circuit; P-channel MOS transistors 142a to 142d and P-channel MOS transistors 143a to 143d that are connected with a power supply line 141 and form four constant current sources; a switch circuit 131 that connects the gates of the P-channel MOS transistors 143b to 143d with the power supply line 141 to turn OFF a corresponding constant current source; a switch circuit 132 that connects the gates of the P-channel MOS transistors 143b to 143d with the drains of the P-channel MOS transistors 142b to 142d to turn ON a corresponding constant current source; P-channel MOS transistors 144a and 144b that serve as a switch to output a logic; and terminating resistors 145a and 145b that are connected with the ground line 138. Input terminals 136a and 136b input differential logic signals inside the LSI, and in response to those inputs, a voltage value that is determined by the all current values flowing through the P-channel MOS transistors 143a, 143b, 143c, 143d and the resistances of the terminating resistors 145a and 145b is output as a logic amplitude from output terminals 147a and 147b.

The constant current source that is composed of the P-channel MOS transistors 142a and 143a, the constant current source that is composed of the P-channel MOS transistors 142b and 143b, the constant current source that is composed of the P-channel MOS transistors 142c and 143c, and the constant current source that is composed of the P-channel MOS transistors 142d and 143d are referred to hereinafter as a constant current source a, a constant current source b, a constant current source c, and a constant current source d, respectively. These constant current sources serve as a driver current generation unit.

As shown in FIG. 1, the constant current source a that is composed of the P-channel MOS transistors 142a and 143a is configured to constantly stay in the ON state.

The ON/OFF state of the constant current source b, the constant current source c, and the constant current source d is controlled by the switch circuit 131 and the switch circuit 132. The switches that are included in the switch circuit 131 and the switch circuit 132 are controlled through a control terminal 133A.

FIGS. 2 to 5 show the combinations of the ON/OFF state of each switch of the switch circuit 131 and each switch of the switch circuit 132 and the ON/OFF state of each constant current source.

Figure 2:
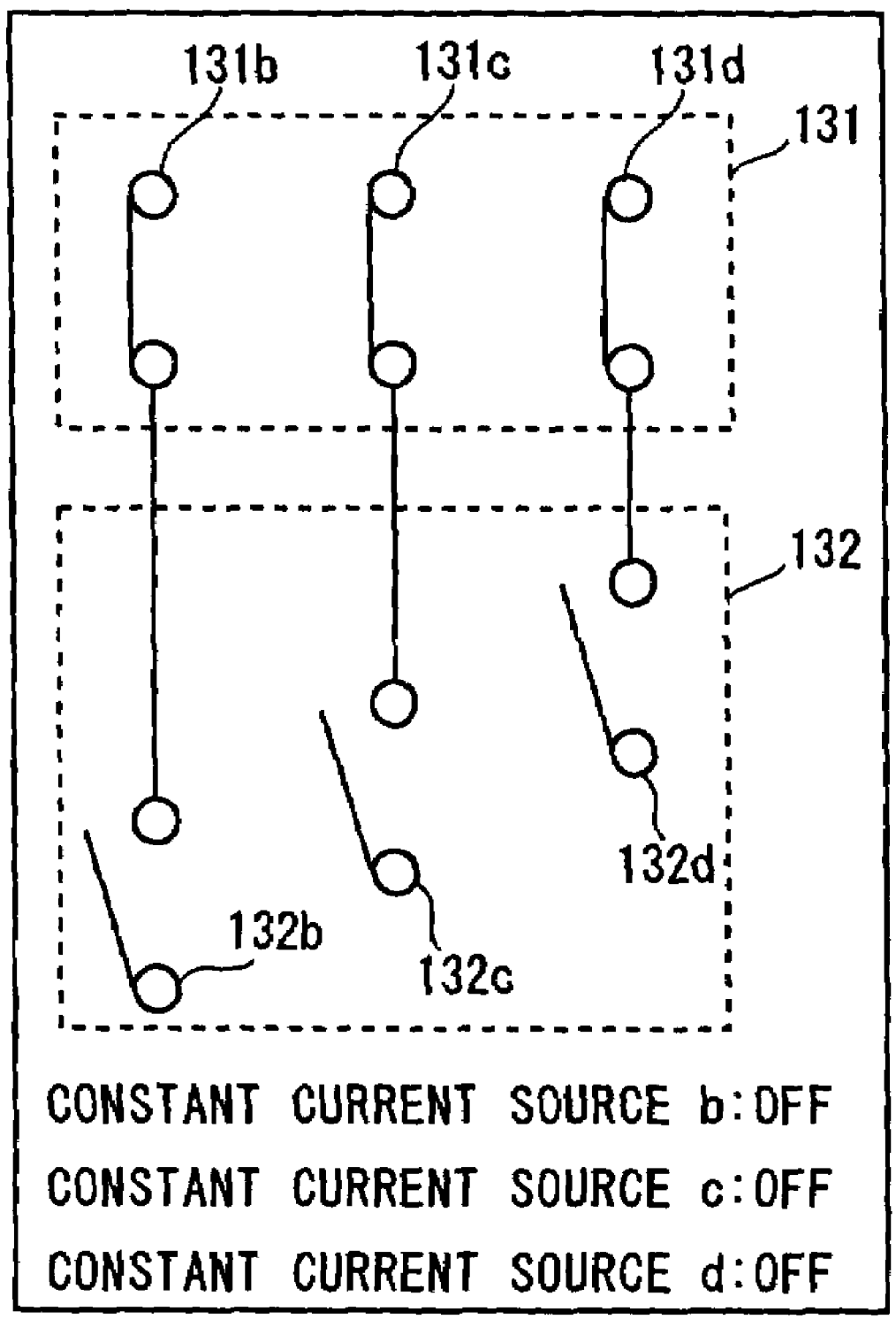
FIG. 2 is a first view to describe a current supply circuit in the signal transmission circuit shown in FIG. 1.

In the combination shown in FIG. 2, switches 131b, 131c and 131d of the switch circuit 131 are ON, and switches 132b, 132c and 132d of the switch circuit 132 are OFF. Because the switch 131b is ON and the switch 132b is OFF, the gate of the P-channel MOS transistor 143b is connected with the power supply line 141, so that the constant current source b is OFF. There is thus no current output from the drain of the P-channel MOS transistor 143b. Likewise, the constant current source c and the constant current source d are both OFF, and there is no current output from the drains of the P-channel MOS transistors 143c and 143d.

Accordingly, in the combination of FIG. 2, a current that flows into the sources of the P-channel MOS transistors 144a and 144b is only a current from the constant current source a, which is, a current from the source of the P-channel MOS transistor 143a.

Figure 3:
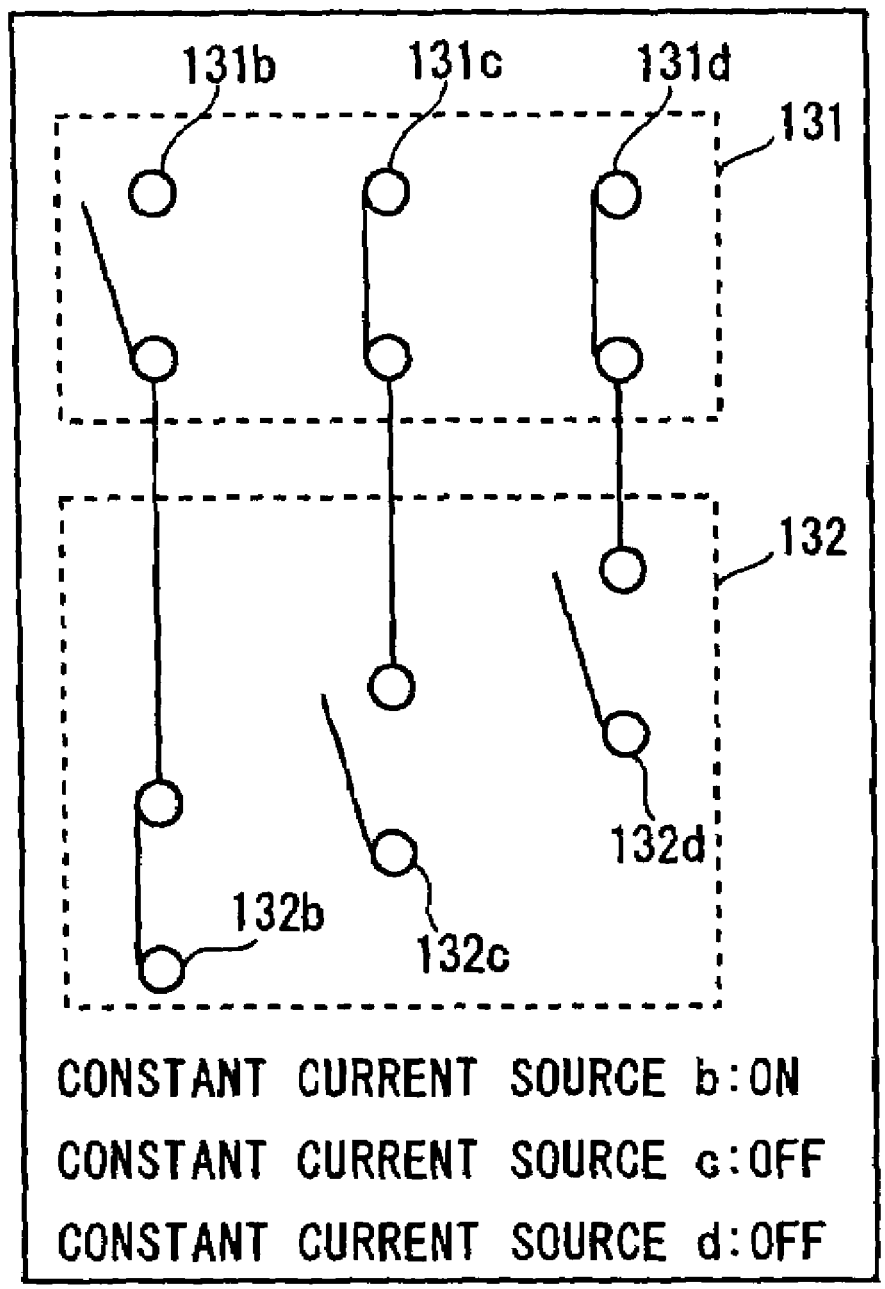
FIG. 3 is a second view to describe a current supply circuit in the signal transmission circuit shown in FIG. 1.

In the combination shown in FIG. 3, only the switch 131b is OFF in the switch circuit 131, and only the switch 132b is ON in the switch circuit 132. In such a case, the gate of the P-channel MOS transistor 143b that forms the constant current source b is connected with the drain of the P-channel MOS transistor 142b through the switch 132b, so that the constant current source b is ON. The constant current source c and the constant current source d are OFF.

Accordingly, in the combination of FIG. 3, a current that flows into the sources of the P-channel MOS transistors 144a and 144b is a total sum of the currents from the constant current source a and the constant current source b.

Figure 4:
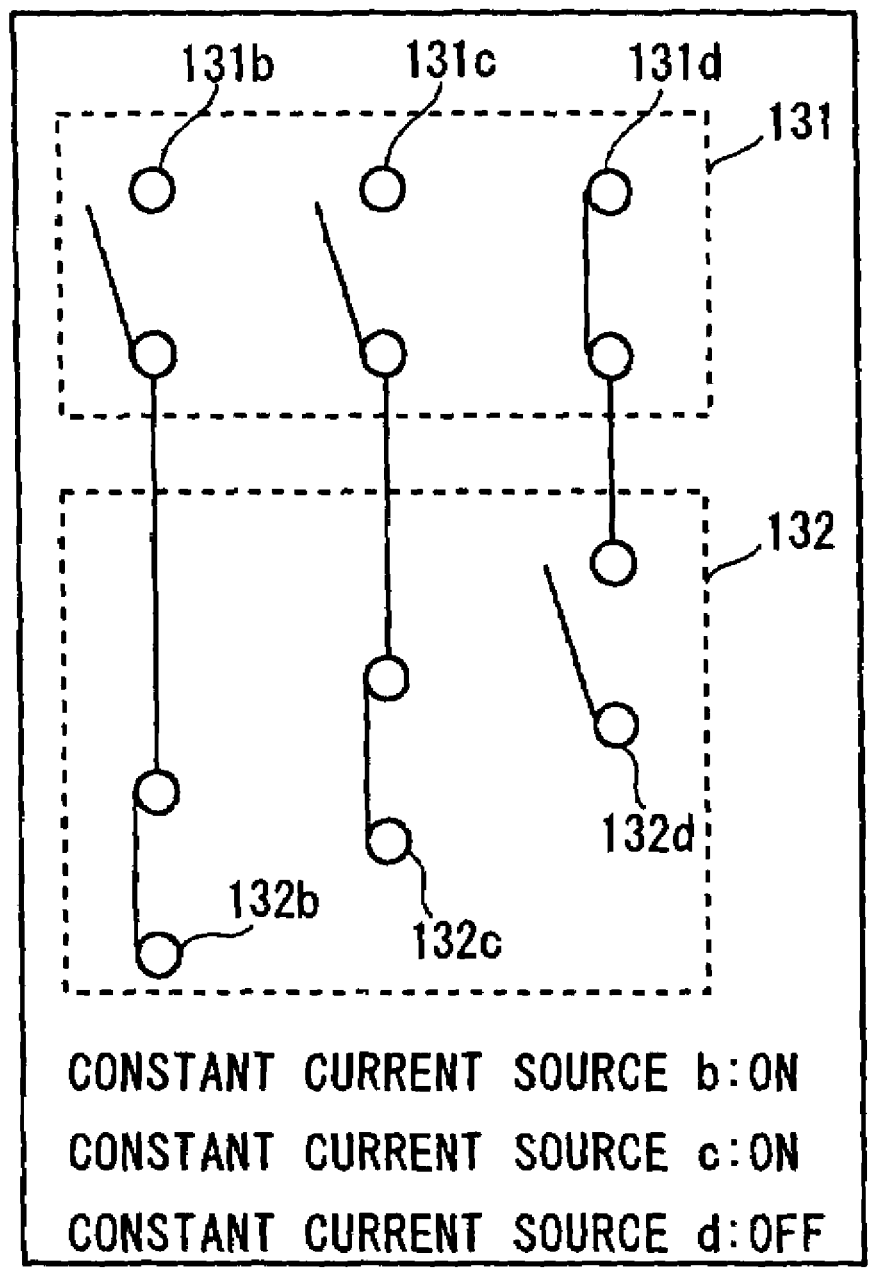
FIG. 4 is a third view to describe a current supply circuit in the signal transmission circuit shown in FIG. 1.

In the combination shown in FIG. 4, the constant current source b and the constant current source c are ON, and the constant current source d is OFF. Accordingly, a current that flows into the sources of the P-channel MOS transistors 144a and 144b is a total sum of the currents from the constant current source a, the constant current source b, and the constant current source c.

Figure 5:
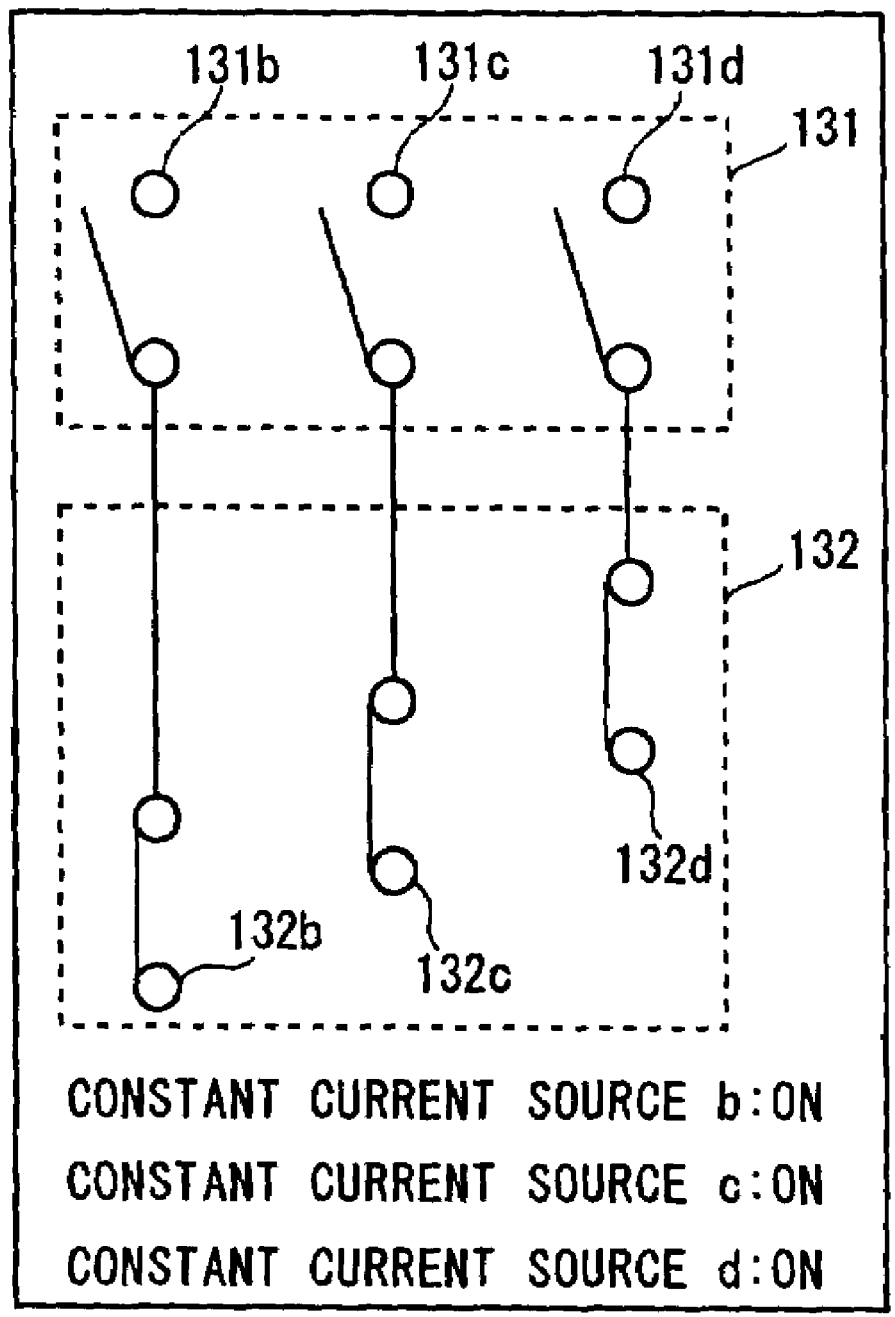
FIG. 5 is a fourth view to describe a current supply circuit in the signal transmission circuit shown in FIG. 1.

In the combination shown in FIG. 5, all of the constant current sources are ON. Accordingly, a current that flows into the sources of the P-channel MOS transistors 144a and 144b is a total sum of the currents from the four constant current sources a, b, c and d.

In this manner, the switch pairs in the switch circuit 131 and the switch circuit 132 are selected in a complementary fashion, thereby controlling the current flowing into the sources of the P-channel MOS transistors 144a and 144b in the differential driver circuit 130A. The output amplitude from the output terminals 147a and 147b of the differential driver circuit 130A is determined by the current flowing to the sources of the P-channel MOS transistors 144a and 144b and the resistances of the terminating resistors 145a and 145b. Thus, the output amplitude from the differential driver circuit 130A corresponds to the reference amplitude and is variable in accordance with the combinations of the switch circuit 131 and the switch circuit 132 shown in FIGS. 2 to 5.

Because the amplitude of the voltage that is output from the output terminals 147a and 147b varies depending on the combination of the switches in the switch circuit 131 and the switch circuit 132, the switch circuit 131 and the switch circuit 132 serve as a driver control unit.

Because the P-channel MOS transistors 144a and 144b, the terminating resistors 145a and 145b and the output terminals 147a and 147b output a voltage having the amplitude corresponding to a total sum of the currents from the four constant current sources a, b, c and d, they serve as a voltage output unit of the differential driver circuit 130A.

The operation of the signal transmission circuit 100 shown in FIG. 1 is described hereinafter with a specific example. Firstly, the transistors, the terminating resistors, and the combination of the switch circuits in the differential driver circuits 130A to 130D are described hereinafter.

The P-channel MOS transistor 125 and the P-channel MOS transistors 144a and 144b are configured to be the same. The terminating resistor 123 and the terminating resistors 145a and 145b are also configured to be the same. The channel width size ratio of the P-channel MOS transistor 121 with each of the P-channel MOS transistors 122a to 122d is "5:1". The channel width size ratio of the P-channel MOS transistors 142a to 142d is "1:1:1:1", and the channel width size ratio of the P-channel MOS transistors 143a to 143d is "5:1:1:1". In such conditions, if the size ratio of the P-channel MOS transistors 142a and 143a that form the constant current source a is "1:5", the channel width size ratio of the transistor pair that form the constant current source b, the constant current source c and the constant current source d is "1:1".

In such a configuration, if the reference amplitude that is output from the analog selector 126 of the current supply circuit 120 is 500 mV, the output amplitude of the differential driver circuit can be 500 mV, 600 mV, 700 mV and 800 mV, respectively corresponding to the combinations of the switches shown in FIGS. 2 to 5. FIG. 1 illustrates an example of the setting during normal operation. The output amplitude of each differential driver circuit 130 is set for each lane according to the trace length of DIMM, for example. In this example, the analog selector 126 selects the output voltage 500 mV from the constant voltage circuit 110. To be more specific about each differential driver circuit, the differential driver circuit 130A is set to the combination of the switches shown in FIG. 2, so that it outputs a voltage having the output amplitude of 500 mV for the reference amplitude of 500 mV. The differential driver circuit 130B is set to the combination of the switches shown in FIG. 3, so that it outputs a voltage having the output amplitude of 600 mV for the reference amplitude of 500 mV. The differential driver circuit 130C is set to the combination of the switches shown in FIG. 4, so that it outputs a voltage having the output amplitude of 700 mV for the reference amplitude of 500 mV. The differential driver circuit 130D is set to the combination of the switches shown in FIG. 5, so that it outputs a voltage having the output amplitude of 800 mV for the reference amplitude of 500 mV. In the following description, the output amplitude of 500 mV, 600 mV, 700 mV and 800 mV is referred to as a maximum output amplitude of each differential driver circuit.

In the margin test, if the analog selector 126 of the current supply circuit 120 selects any one of the divided voltages with different values that are obtained by the voltage divider circuit 115, the reference amplitude is smaller than 500 mV. Thus, the output amplitude that is smaller than each maximum output amplitude is obtained from each differential driver circuit. For example, if the voltage dividing ratio of the ladder resistors of the voltage divider circuit 115 is designed in increments of 5%, it is possible to select, by the analog selector 126, 100%, 95%, 90%, 85% ... of the output voltage of the constant voltage circuit 110 as the reference amplitude. Accordingly, for each of the reference amplitude, the output amplitude that is variable like "500 mV, 600 mV, 700 mV and 800 mV", "475 mV, 570 mV, 665 mV and 760 mV", "450 mV, 540 mV, 630 mV and 720 mV", "425 mV, 510 mV, 595 mV and 680 mV" ... can be obtained from each differential driver circuit.

As described above, because the signal transmission circuit 100 of this embodiment uses the common constant voltage circuit 110 and the common current supply circuit 120 for each of the differential driver circuits in the signal transmission circuit having a plurality of lanes, it is possible to suppress an increase in circuit size.

Further, by changing the reference amplitude that is selected by the analog selector 126 in the current supply circuit 120, the voltage-current conversion ratio for the constant current that is output from the current supply circuit 120 and the constant voltage that is output from the constant voltage circuit 110 can be altered, which changes the current to be supplied to each differential driver circuit. It is therefore possible to reduce a constant current to be supplied to each differential driver circuit and thus to simultaneously reduce the output amplitude of each differential driver circuit at a constant rate with respect to the maximum output amplitude, simply by changing the selection of the analog selector 126 during the margin test. As a result, the margin test can be performed easily at high-speed.

Generally, the transmission of a reference signal in a chip is more vulnerable to a parasitic component or noise of a line as a distance between circuits is longer, and therefore it is more stable to distribute a signal in the form of current rather than in the form of voltage. For this reason, the signal transmission circuit 100 supplies the voltage from the analog selector 126 in the form of current to each differential driver circuit 130, thereby enabling stable signal distribution.

The signal transmission circuit 100 of this embodiment sets the value of the output amplitude of the driver circuit in each lane by the combination of the switch circuits, and sets the reference amplitude that serves as a basis for the output amplitude by the analog selector 126 of the current supply circuit 120. Because the two settings are performed independently of each other, it is possible to set the output amplitude of the lane corresponding to each differential driver circuit according to a trace difference in signal lines on DIMM of the lane during the normal operation. During the margin testing, it is possible to change the output amplitude of each differential driver circuit to the output amplitude smaller than its maximum output amplitude by small steps by changing the selection of the analog selector 126 in the current supply circuit 120.

The signal transmission circuit 100 of this embodiment is now compared with the circuit shown in FIG. 7.

Because the circuit shown in FIG. 7 controls the output amplitude by the combination of the sizes of the transistors that form the constant current source of the differential driver circuit 3, it requires a relatively large transistor size. Further, because the output terminal is an external terminal, it is unable to reduce the size of a basic transistor size in consideration of an electrostatic withstand voltage (which is referred to hereinafter as an ESD withstand voltage). Therefore, the amplitude can be adjusted only by large steps of about 20%, for example, and it is impossible to set the output amplitude in small steps of about 5%, for example, which is required in the margin test.

Further, in the circuit of FIG. 7, the number of constant current sources in the final stage of the differential driver circuit 3 depends on the current mirror circuit in the previous stage. In order to increase the number of values that the output amplitude can be, it is necessary to increase the number of constant current sources, which requires an increase in the number of current mirror circuits in parallel in the previous stage. This complicates the circuit and increases the circuit size.

On the other hand, the signal transmission circuit 100 can vary the current to be supplied from the current supply circuit 120 to each differential driver circuit by small steps while allowing the driver circuit to have the same configuration as the differential driver circuit 3 of FIG. 7. This enables the output amplitude to be variable in small steps without reducing the transistor size in the differential driver circuit and further allows an increase in the number of values that the output amplitude can be without increasing the current mirror circuits in the previous stage in the differential driver circuit.

Figure 6:
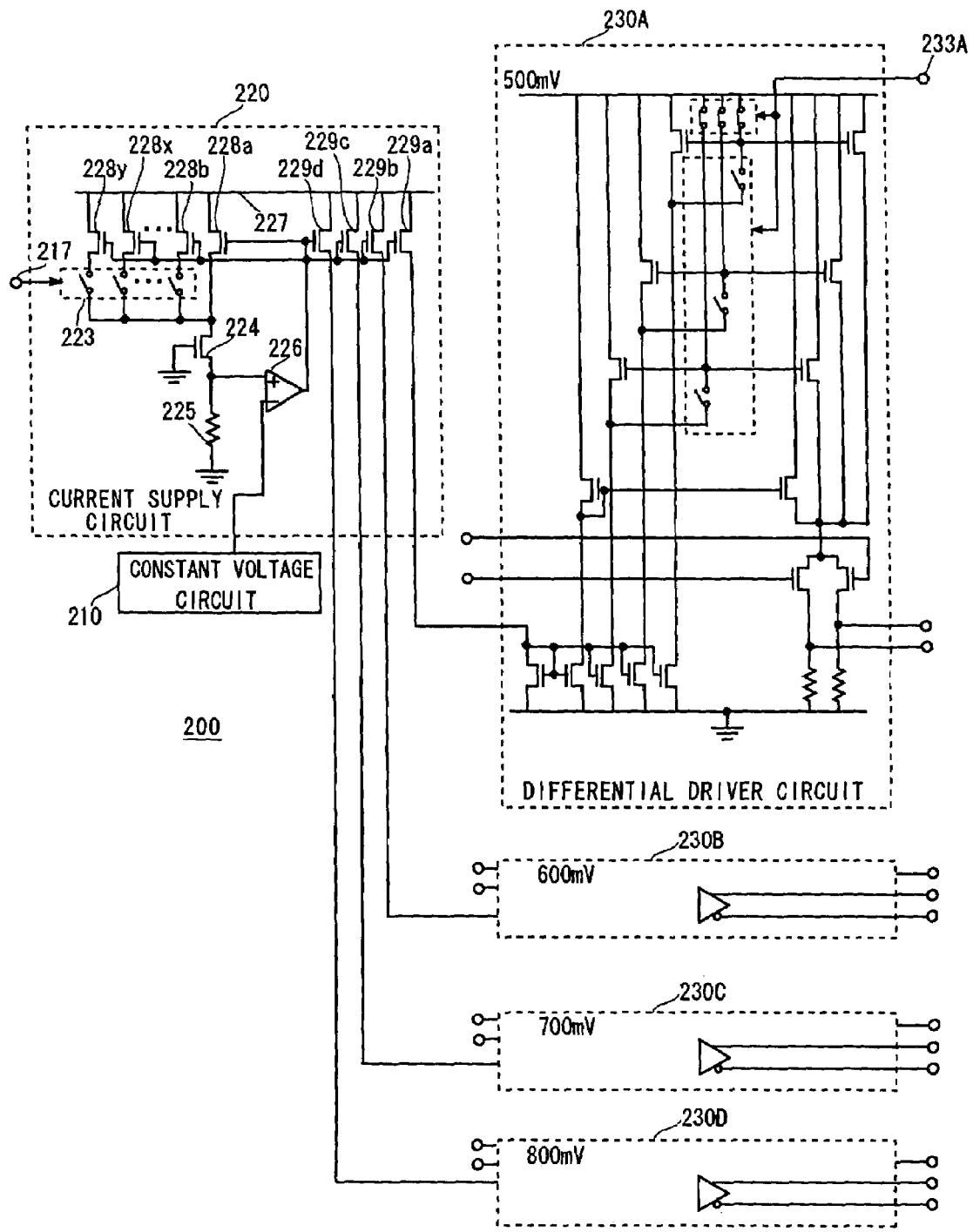
FIG. 6 is a view showing the configuration of a signal transmission circuit according to a second embodiment of the present invention.

The signal transmission circuit 100 of FIG. 1 adjusts a constant current to be supplied to each differential driver circuit by dividing the constant voltage supplied from the constant voltage circuit 110, which is a bandgap reference circuit, using the ladder resistors and then selectively outputting one voltage. However, another technique may be used as long as an adjustable constant current can be supplied to a differential driver circuit. FIG. 6 shows a second embodiment that employs another technique.

A signal transmission circuit 200 of the second embodiment of the present invention has a plurality of lanes, in which a different output amplitude can be set for each lane. The signal transmission circuit 200 includes a constant voltage circuit 210, a current supply circuit 220, and four differential driver circuits 230A to 230D, which correspond to the number of lanes.

The constant voltage circuit 210 is a bandgap reference circuit that is similar to the constant voltage circuit 110 in the signal transmission circuit 100, and it outputs a constant voltage.

The current supply circuit 220 includes P-channel MOS transistors 228a, 228b, . . . 228x, 228y, P-channel MOS transistors 229a to 229d, a switch circuit 223, a P-channel MOS transistor 224, a terminating resistor 225, and a feedback amplifier 226.

The sources of the P-channel MOS transistors 228a, 228b, . . . 228x, 228y are connected with a power supply line 227. The gate electrode of the P-channel MOS transistor 224 is fixed to a ground voltage level, so that the P-channel MOS transistor 224 is in the ON state. The feedback amplifier 226 has an inverting terminal connected with the output of the constant voltage circuit 210, a non-inverting terminal connected with a node between the P-channel MOS transistor 224 and the terminating resistor 225, and an output connected with the gates of the P-channel MOS transistors 228a, 228b, . . . 228x, 228y and the P-channel MOS transistors 229a to 229d.

The P-channel MOS transistors 228a, 228b, . . . 228x, 228y, the P-channel MOS transistor 224, the feedback amplifier 226, and the terminating resistor 225 form constant current sources of the same number as the P-channel MOS transistors 228a, 228b, . . . 228x, 228y, and they function as a constant current generation unit.

The P-channel MOS transistor 229a forms a mirror circuit together with the P-channel MOS transistors 228a to 228y. A total sum of the currents flowing through the P-channel MOS transistors 228a, 228b, . . . 228x, 228y is output from the drain of the P-channel MOS transistor 229a.

This is the same for the P-channel MOS transistors 229b to 229d, and a total sum of the currents flowing through the P-channel MOS transistors 228a, 228b, . . . 228x, 228y is output from each drain of the P-channel MOS transistors 229b to 229d.

Hence, the P-channel MOS transistors 229a to 229d serve as a constant current output unit.

As shown in FIG. 6, the P-channel MOS transistor 228a is constantly ON, and the ON/OFF state of the P-channel MOS transistors 228b . . . 228x, 228y is controlled by the switch circuit 223. The switch circuit 223 is controlled through a selection terminal 217. As the number of transistors that are turned ON by the switch circuit 223 is larger, the current that is output from the current supply circuit 220 becomes higher. In the example of FIG. 6, each switch of the switch circuit 223 is OFF, so that the P-channel MOS transistors 228a, 228b, . . . 228x, 228y are all OFF. In such a case, a current that is supplied to the differential driver circuits 230A to 230D from the current supply circuit 220 is only the current flowing through the P-channel MOS transistor 228a.

The differential driver circuits 230A to 230D have the same configuration as the differential driver circuits 130A to 130D in the signal transmission circuit 100 shown in FIG. 1, and are thus not described in detail herein.

For example, the reference amplitude from the constant voltage circuit 210 is 500 mV, and the resistance of each terminating resistor is the same, just like the case used in the description of the signal transmission circuit 100 shown in FIG. 1. Further, in the current supply circuit 220, the channel width size ratio of the P-channel MOS transistors 229a to 229d is "1:1:1:1", and the channel width size ratio of the P-channel MOS transistor 228a and the P-channel MOS transistor 229d is "5:1".

The current supply circuit 220 is a closed circuit inside a chip. Therefore, there is no problem of ESD withstand voltage, and further the transistor size can be reduced by adjusting a circuit constant. It is thus possible to easily increase the number of the P-channel MOS transistors 228b, . . . 228x, 228y according to need. In this embodiment, the channel width size of the P-channel MOS transistors 228b, . . . 228x, 228y may be decremented in steps of 5% from 95% with respect to the channel width size of the P-channel MOS transistor 229d. This enables the current that is output from the current supply circuit 220 to be selected in small steps.

In such a configuration, the differential driver circuits are set so that the output amplitudes of the differential driver circuits 230A to 230D are 500 mV, 600 mV, 700 mV and 800 mV for the reference amplitude of 500 mV that is output from the constant voltage circuit 210 when each switch of the switch circuit 223 is ON. When each switch of the switch circuit 223 is ON, the current that is supplied from the current supply circuit 220 to each differential driver circuit is a maximum value. Accordingly, 500 mV, 600 mV, 700 mV and 800 mV are the maximum output amplitudes of the respective differential driver circuits. This is the setting during the normal operation, and the output amplitude of each differential driver circuit is set for each lane according to a trace length of DIMM.

During the margin test, if the current from the current supply circuit 220 is controlled by controlling the ON/OFF state of each switch in the switch circuit 223 through the selection terminal 217, the output amplitude that is variable like "500 mV, 600 mV, 700 mV and 800 mV", "475 mV, 570 mV, 665 mV and 760 mV", "450 mV, 540 mV, 630 mV and 720 mV", "425 mV, 510 mV, 595 mV and 680 mV" can be obtained.

In this manner, the signal transmission circuit 200 of the second embodiment has the same effect as the signal transmission circuit 100.

Although the above-described two signal transmission circuits set the maximum output amplitude of each driver circuit according to a difference in the trace length of signal lines on DIMM, the present invention may be applied to the connection between modules in which a transmission distance of each lane is different, such as the case where there are both the connection between a MPU and a memory module with a relatively long transmission distance, and the connection between a memory module and a memory module with a relatively short transmission distance. Further, it is compatible with the setting configured in consideration of both a difference in the trace length of signal lines on DIMM and the presence different transmission distances between modules.

Although the present invention is described in the context of the embodiments, it is apparent that the present invention is not limited to the above embodiments, but may be modified and changed without departing from the scope and spirit of the invention.

What is claimed is:

1. A signal transmission circuit including two or more prescribed number of lanes, comprising:
   a constant voltage circuit to generate a constant voltage;
   a current supply circuit to receive the constant voltage from the constant voltage circuit, and generate and output in parallel the prescribed number of currents having a value corresponding to a prescribed voltage-current conversion ratio; and
   a driver circuit placed for each lane to receive a current output from the current supply circuit and output a voltage having an amplitude corresponding to the prescribed voltage-current conversion ratio, wherein
   the current supply circuit includes:
      a current supply control circuit capable of changing the prescribed voltage-current conversion ratio;
      a constant current generation unit to generate a constant current having a value corresponding to an input voltage; and a constant current output unit including the prescribed number of output terminals to output the constant current generated in the constant current generation unit from each output terminal to a corresponding driver circuit, and the current supply control circuit comprises:
a voltage divider circuit to divide the constant voltage from the constant voltage circuit and obtain a plurality of output voltages; and
a selector to select one from the constant voltage and the plurality of output voltages and output the selected one to the constant current generation unit.

2. A signal transmission circuit including two or more prescribed number of lanes, comprising:
a constant voltage circuit to generate a constant voltage;
a current supply circuit to receive the constant voltage from the constant voltage circuit, and generate and output in parallel the prescribed number of currents having a value corresponding to a prescribed voltage-current conversion ratio; and
a driver circuit placed for each lane to receive a current output from the current supply circuit and output a voltage having an amplitude corresponding to the prescribed voltage-current conversion ratio, wherein
the current supply circuit includes:
a current supply control circuit capable of changing the prescribed voltage-current conversion ratio;
a plurality of constant current generation units arranged in parallel to generate constant currents having a value corresponding to an input voltage; and
a constant current output unit including the prescribed number of output terminals to output a total sum of constant currents generated in the plurality of constant current generation units from the output terminals, and
the current supply control circuit is a switch circuit capable of turning ON/OFF at least one of the plurality of constant current generation units.

3. The signal transmission circuit according to claim 2, wherein the driver circuit comprises a driver control unit capable of changing the amplitude of voltage corresponding to the prescribed voltage-current conversion ratio.

4. The signal transmission circuit according to claim 3, wherein the driver circuit comprises:
a plurality of driver constant current generation units arranged in parallel to generate constant currents having a value corresponding to an input current; and
a voltage output unit to output a voltage having an amplitude corresponding to a total sum of constant currents generated by the driver constant current generation units, and the driver control unit comprises a switch circuit capable of turning ON/OFF at least one of the plurality of driver constant current generation units.

5. The signal transmission circuit according to claim 3, wherein an increment of the amplitude by the driver control unit is larger than an increment of amplitude due to variation of the prescribed voltage current conversion ratio by the current supply control circuit.

6. The signal transmission circuit according to claim 2, wherein the total sum of constant currents is common to the prescribed number of output terminals.

7. A signal transmission circuit including two or more prescribed number of lanes, comprising:
a constant voltage circuit to generate a constant voltage;
a current supply circuit to receive the constant voltage from the constant voltage circuit, and generate and output in parallel the prescribed number of currents having a value corresponding to a prescribed voltage-current conversion ratio; and
a driver circuit placed for each lane to receive a current output from the current supply circuit and output a voltage having an amplitude corresponding to the prescribed voltage-current conversion ratio, wherein
the current supply circuit includes a current supply control circuit capable of changing the prescribed voltage-current conversion ratio, and
the driver circuit comprises a driver control unit capable of changing the amplitude corresponding to the prescribed voltage-current conversion ratio.

8. The signal transmission circuit according to claim 7, wherein the driver circuit comprises:
a plurality of driver constant current generation units arranged in parallel to generate constant currents having a value corresponding to an input current; and
a voltage output unit to output a voltage having an amplitude corresponding to a total sum of constant currents generated by the driver constant current generation units, and the driver control unit comprises a switch circuit capable of turning ON/OFF at least one of the plurality of driver constant current generation units.

9. The signal transmission circuit according to claim 7, wherein an increment of the amplitude by the driver control unit is larger than an increment of amplitude due to variation of the prescribed voltage current conversion ratio by the current supply control circuit.

10. The signal transmission circuit according to claim 9, wherein the amplitudes vary by lane.

11. A signal transmission circuit including two or more prescribed number of lanes, comprising:
a constant voltage circuit to generate a constant voltage;
a current supply circuit to receive the constant voltage from the constant voltage circuit, and generate and output in parallel the prescribed number of currents having a value corresponding to a prescribed voltage-current conversion ratio, the current supply circuit including a current supply control circuit capable of changing the prescribed voltage-current conversion ratio; and
a driver circuit placed for each lane to receive a current output from the current supply circuit and output a voltage having an amplitude corresponding to the prescribed voltage-current conversion ratio, the driver circuit setting the amplitude of each lane in accordance with a transmission length.

* * * * *

UNITED STATES PATENT AND TRADEMARK OFFICE
CERTIFICATE OF CORRECTION

PATENT NO. : 7,667,531 B2
APPLICATION NO. : 11/905685
DATED : February 23, 2010
INVENTOR(S) : Tadashi Iwasaki It is certified that error appears in the above-identified patent and that said Letters Patent is hereby corrected as shown below:

On the Title Pg, Item 57, at lines 10-11 of the ABSTRACT; the words "the prescribed voltage current" should read --a prescribed current-voltage--.

Column 4, at lines 66-67, the words "the prescibed voltage-current" should read --a prescribed current -voltage--.

In claim 1, column 12, lines 60-61, change "the prescribed voltage-current" to --a prescribed current-voltage--.

In claim 2, column 13, lines 23-24, change "the prescribed voltage-current" to --a prescribed current-voltage--.

In claim 3 , column 13, lines 41-42, change "amplitude of voltage corresponding to the prescribed voltage-current" to --prescribed current-voltage--.

In claim 7, column 14, lines 14 and 15, change "the prescribed voltage-current" to --a prescribed current-voltage; and in lines 20-21, change "amplitude corrresponding to the prescribed voltage-current" to --prescribed current-voltage--.

In claim 10, column 14, line 40, change "amplitudes" to --prescribed current-voltage conversion ratios--.

In claim 11, column 14, lines 33-34, change "the prescribed voltage-current" to --a prescribed current-voltage--; and in line 55, change "amplitude" to --prescribed current-voltage conversion ratio--.

Signed and Sealed this
Twenty-eighth Day of February, 2012

David J. Kappos
*Director of the United States Patent and Trademark Office*